United States Patent
Ashdown

(10) Patent No.: US 11,287,321 B2
(45) Date of Patent: Mar. 29, 2022

(54) PREDICTING AND MEASURING MELANOPIC DOSE

(71) Applicant: SUNTRACKER TECHNOLOGIES LTD., Victoria (CA)

(72) Inventor: Ian Edward Ashdown, West Vancouver (CA)

(*) Notice: Subject to any disclaimer, the term of this patent is extended or adjusted under 35 U.S.C. 154(b) by 0 days.

(21) Appl. No.: 17/419,868

(22) PCT Filed: Mar. 22, 2021

(86) PCT No.: PCT/CA2021/050372
§ 371 (c)(1),
(2) Date: Jun. 30, 2021

(65) Prior Publication Data
US 2022/0042848 A1 Feb. 10, 2022

Related U.S. Application Data

(60) Provisional application No. 63/116,371, filed on Nov. 20, 2020, provisional application No. 63/105,149, filed on Oct. 23, 2020, provisional application No. 63/049,292, filed on Jul. 8, 2020.

(51) Int. Cl.
| | |
|---|---|
| *G01J 3/02* | (2006.01) |
| *G01J 3/28* | (2006.01) |
| *G06F 30/13* | (2020.01) |
| *H04N 5/232* | (2006.01) |

(52) U.S. Cl.
CPC .............. *G01J 3/28* (2013.01); *G01J 3/0297* (2013.01); *G06F 30/13* (2020.01); *H04N 5/23238* (2013.01)

(58) Field of Classification Search
CPC ... G01J 3/02; G01J 3/28; G01J 3/0297; G06F 30/13; H04N 5/23238
See application file for complete search history.

(56) References Cited

U.S. PATENT DOCUMENTS

2017/0086274 A1 3/2017 Soler
2019/0209858 A1* 7/2019 Slaughter ............. A61N 5/0613

FOREIGN PATENT DOCUMENTS

| WO | 2018130403 | 7/2018 |
| WO | 2018227305 | 12/2018 |
| WO | 2020221840 | 11/2020 |

OTHER PUBLICATIONS

CIE System for Metrology of Optical Radiation for ipRGC-Influenced Responses to Light, CIE S 026/E:2018.

(Continued)

*Primary Examiner* — Abdullahi Nur

(57) ABSTRACT

Melanopic dose rate and dose are calculated in a virtual environment. A computer generated model of an actual or planned building is used as the virtual environment. Indirect and direct spherical irradiances are calculated using convex polyhedra throughout the virtual environment, and each is multiplied by a melanopic conversion factor. The two are added, then adjusted for a human's angular responsivity and age. Building design features or lighting devices may be adjusted to provide a required melanopic dose rate. A camera is used to capture a panoramic image, which is calibrated to tristimulus values, and used with the spectral power distribution of the light sources to derive the melanopic dose rate.

15 Claims, 9 Drawing Sheets

(56) References Cited

OTHER PUBLICATIONS

Bellia, L., and F. Bisegna. 2013. "From Radiometry to Circadian Photometry: A Theoretical Approach," Building and Environment 62:63-68.
The Well Building Standard v1 with Q1 2019 Addenda.
UL RP 24480, Recommended Practice and Design Guideline for Promoting Circadian Entrainment with Light for Day-Active People.
Ashdown, I. 2019. "Challenging the Circadian Metric," LD+A December, pp. 36-39.
Lee, R. Lr, and J. Hernández-Andrés. 2006. "Colors of the Daytime Overcast Sky," Applied Optics 44(27):5712-5722.
Ashdown, I. 2019. "Climate-based Annual Daylight Modelling for Greenhouses with Supplemental Electric Lighting," ISHS Acta Horticulturae 1296, International Symposium in Advanced Technologies and Management for Innovative Greenhouses: GreenSys 2019, pp. 583-590.
Ashdown, I. 2017. "Analytic BSDF Modeling for Daylight Design," IES Annual Conference, Portland, OR, Aug. 10-12.
Luckiesh, M., and S. K. Guth. 1949. "Brightnesses in Visual Field at Borderline Between Comfort and Discomfort (BCD)," Illuminating Engineering, November, pp. 650-670.
Turner, P. L., and M. A. Mainster. 2008. "Circadian Photoreception: Ageing and the Eye's Important Role in Systemic Health," British Journal of Ophthalmology 92:1439-1444.
Barroso, A., et al. 2014. "Metrics of Circadian Lighting for Clinical Investigations," Lighting Research and Technology 46:637-649.
Hong et al. 2018. "Occupant Behavior Models: A Critical Review of Implementation and Representation Approaches in Building Performance Simulation Programs," Building Simulation 11(1):1-14.
Phillips, A. J. K., et al. 2019. "High Sensitivity and Interindividual Variability in the Response of the Human Circadian System to Evening Light," PNAS (https://doi.org/10.1073/pnas.1901824116).
Walmsley, L., et al. 2015. "Colour as a Signal for Entraining the Mammalian Circadian Clock," PLOS Biology 13(4): e1002127.
Hubbard, K., and A. Dodd. 2016. "Rhythms of Life: The Plant Circadian Clock," The Plant Cell, April, pp. 1-10.
Pauers, M. J., et al. et al. 2012. "Changes in the Colour of Light Cue Circadian Activity," Animal Behavior 83 (5):1143-1151.
Ashdown, I. 1994. Radiosity: A Programmer's Perspective. New York, NY: John Wiley & Sons.
Guth, S. K. 1951. "Brightness Relationships for Comfortable Seeing," Journal of the Optical Society of America 41(4):235-244.
Levin, R. E. 1975. "Position Index in VCP Calculations," Journal of the Illuminating Engineering Society 4(2):99-105.
Jakubiec. J. A. and C. F. Reinhart. 201. "The 'Adaptive Zone'—A Concept for Assessing Discomfort Glare throughout Daylight Space," Lighting Research and Technology 44(2)149-170.
Bruneton, E. 2016. "A Qualitative and Quantitative Evaluation of 8 Clear Sky Models," IEEE Transactions on Visualization and Computer Graphics 23(12):2641-2655.
Patterson, S. S., et al. 2020. "A Color Vision Circuit for Non-Image-Forming Vision in the Primate Retina," Current Biology 30:1.

* cited by examiner

ELECTRIC LIGHTING

DAYLIGHTING

COMBINED

PREDICTING AND MEASURING MELANOPIC DOSE

TECHNICAL FIELD

The subject matter of the present invention relates to the prediction and measurement of melanopic dose in geometrically complex environments.

BACKGROUND

In addition to conveying visual images to the brain, the human eye initiates a range of non-visual responses to incident optical radiation, including circadian rhythm entrainment or disruption, melatonin suppression, and alertness. A common factor to these responses is that unlike the visual system with response times of milliseconds to tens of milliseconds, the response times of non-visual systems range from a few minutes to many hours.

The human eye further has an action spectrum, commonly referred to as the photopic luminous efficiency function $V(\lambda)$, which is determined by the spectral responsivity of cones in the human retina, and which was established by the Commission International de l'Eclairage in 1924 (e.g., Colorimetry, Fourth Edition, CIE 015:2018). More recently, researchers have established the spectral responsivity of the intrinsically photosensitive retinal ganglion cells (ipRGCs) in the human retina, and from this have defined an equivalent melanopic action spectrum that is presumed to mediate non-visual responses (CIE System for Metrology of Optical Radiation for ipRGC-Influenced Responses to Light, CIE S 026/E:2018). Both action spectra are shown in FIG. 1.

For visual responses and the visual action function, the relevant metric is corneal illuminance, expressed in lux (lumens per square meter) and measured at a position and orientation representing that of an observer. For non-visual responses and the melanopic action spectrum, the equivalent metric is melanopic irradiance, expressed in watts per square meter (CIE System for Metrology of Optical Radiation for ipRGC-Influenced Responses to Light, CIE S 026/E:2018). The "melanopic ratio" is defined as the ratio of melanopic irradiance to illuminance when measured at the same position and orientation. However, in the absence of calibrated melanopic irradiance meters, it is necessary to measure spectral irradiance at the same position and orientation, and then convert it to melanopic irradiance by multiplying the spectral irradiance by the melanopic action spectrum on a per-wavelength basis and summing the resultant values.

The current state-of-the-art in professional lighting design for predicting melanopic irradiance takes a simpler approach, consisting of: 1) predicting the vertical illuminance in a virtual environment for a given position and orientation; and 2) multiplying this value by the melanopic ratio, which depends on the spectral power distribution (SPD) of the incident light (e.g., Bellia, L., and F. Bisegna. 2013. "From Radiometry to Circadian Photometry: A Theoretical Approach," Building and Environment 62:63-68), to calculate the Equivalent Melanopic Lux (The Well Building Standard v1 with Q1 2019 Addenda) or Circadian Stimulus (UL RP 24480, Recommended Practice and Design Guideline for Promoting Circadian Entrainment with Light for Day-Active People). These two metrics are closely related to melanopic irradiance (e.g., Ashdown, I. 2019. "Challenging the Circadian Metric," LD+A December, pp. 36-39).

An advantage of this approach is that it is mostly familiar to lighting designers, and requires no additional lighting design software tools to implement. Unfortunately, there are many disadvantages that call into question the accuracy and even meaning of the resultant EML (Equivalent Melanopic Lux) or CS (Circadian Stimulus) metrics for the purpose of predicting non-visual responses (ibid).

One issue is that many occupied environments, including offices and schools, are illuminated by multiple light sources with possibly different SPDs. For example, a workstation in an open office may have both ceiling-mounted luminaires and desktop task lamps, likely with different color temperatures and hence different SPDs and melanopic ratios. Thus, in order to calculate the melanopic irradiance at a given position, it is necessary to group the light sources according to their different SPDs, calculate the predicted contribution of each group to the vertical illuminance, and apply the associated melanopic ratios to determine their contribution to the predicted melanopic irradiance.

Another issue is that in a typical occupied environment, the contribution of light reflected from surfaces may equal or exceed that contributed by direct illumination from the light sources to the predicted melanopic irradiance. If these surfaces are not substantially achromatic (i.e., neutral gray), the SPD of the reflected light will differ significantly from that of the direct light emitted by the light sources. The resultant SPD of the combined direct and indirect irradiance incident on the observer's cornea will thus have a melanopic ratio that is different from that of the light sources, even if they all have the same SPD.

Many office workers spend much of their time during looking at display screens with luminances of 150 to 250 candela per square meter (nits), which are typically an order of magnitude higher than those of surrounding surfaces. The white point SPDs of these displays may vary considerably depending on the display technology, including cold-cathode fluorescent (CCFL), RGB LED, phosphor white LED, GB-LED, and quantum dot LED backlit LCDs, and OLED displays. Neither the Equivalent Melanopic Lux (EML) nor Circadian Stimulus (CS) methods take these light sources into consideration when calculating melanopic irradiance. (The average SPD will vary depending on the displayed content, but office work is typically done with text displayed on a white background.)

Most daytime office workers and schools have ample access to daylight. Depending on the building's geographic latitude and window orientation, this may include a combination of direct sunlight and diffuse daylight on clear days, or diffuse daylight only from a clear or overcast sky. The SPD of direct sunlight and diffuse daylight on both clear and overcast days is remarkably constant throughout most of the day, with an average correlated color temperature (CCT) of 6500 Kelvin (e.g., Lee, R. Lr, and J. Hernandez-Andres. 2006. "Colors of the Daytime Overcast Sky," Applied Optics 44(27):5712-5722). However, the CCT of a clear blue sky can be as high as 20,000 Kelvin, with a much different SPD and melanopic ratio. Again, neither the Equivalent Melanopic Lux (EML) nor Circadian Stimulus (CS) methods take daylight into consideration when calculating melanopic irradiance.

Unlike electric lighting, daylight is a notoriously variable light source. Architects and lighting designers rely on lighting design software to predict the hourly distribution of direct sunlight and diffuse daylight in interior spaces throughout an entire year, based on climate-based TMY3 weather files. Any calculation of melanopic irradiance that includes daylight should take into consideration the time and date to determine the historically representative sky condition for daylight calculations (e.g., Ashdown, I. 2019. "Climate-based Annual Daylight Modelling for Greenhouses with Supplemental Electric Lighting," ISHS Acta Horticulturae 1296, International Symposium in Advanced Technologies and Management for Innovative Greenhouses: GreenSys 2019, pp. 583-590).

Any daylight calculations should further take into consideration manually-operated and automated blinds and shades that may be employed to limit the amount of direct sunlight entering occupied workspaces (e.g., Ashdown, I. 2017. "Analytic BSDF Modeling for Daylight Design," IES Annual Conference, Portland, Oreg., August 10-12). If these fenestration devices are comprised of partially transparent colored materials (e.g., fabrics), they will modify the daylight SPD.

Yet another issue is that the measurement of vertical illuminance (or spectral irradiance) does not take into account the distribution of ipRGCs in the human retina or facial morphology. This is important in that the vertical field of view for most people is approximately 120 degrees (50 degrees above and 70 degrees below the horizontal meridian) indoors and 90 degrees (20 degrees above and 70 degrees below) outdoors in direct sunlight, as opposed to the 180-degree field of view for an illuminance meter (e.g., CIE System for Metrology of Optical Radiation for ipRGC-Influenced Responses to Light, CIE S 026/E:2018). Studies of angular responsivity for ipRGCs have yet to be completed, but studies of visual glare (e.g., Luckiesh, M., and S. K. Guth. 1949. "Brightnesses in Visual Field at Borderline Between Comfort and Discomfort (BCD)," Illuminating Engineering, November, pp. 650-670) indicate that the cosine response of illuminance meters may be a relatively poor proxy for the angular responsivity to melanopic irradiance.

The spectral responsivity of the human eye to melanopic irradiance is also age-related. The peak spectral responsivity of the melanopic action spectrum is nominally 490 nm, but this assumes typical adult vision. The cornea continually yellows with age (FIG. 2), so that young children are more sensitive to blue light, while the elderly are much less sensitive, due to pre-receptoral filtering (Turner, P. L., and M. A. Mainster. 2008. "Circadian Photoreception: Ageing and the Eye's Important Role in Systemic Health," British Journal of Ophthalmology 92:1439-1444). As a result, the non-visual responses to melanopic irradiance will vary with age.

As noted by Barroso, A., et al. 2014. "Metrics of Circadian Lighting for Clinical Investigations," Lighting Research and Technology 46:637-649 and others, the non-visual responses to optical radiation incident on the cornea are determined not by the instantaneous melanopic irradiance, but by its integration over time. Following the Illuminating Engineering Society's definition of "exposure dose" as "quantity per unit exposed area of incident, actinically-effective optical radiant energy", it is appropriate to refer to "melanopic dose" as the integral of melanopic irradiance over time, expressed in joules (watt-seconds) per square meter.

Given this definition, it is clear that the melanopic irradiance of an observer in an occupied environment will vary as the observer moves about the space over a period of minutes to hours. To properly assess the melanopic exposure of the observer and predict non-visual responses such as circadian rhythm entrainment, melatonin suppression, and alertness, it is therefore necessary to stochastically predict the movement of the occupant within the environment. There are numerous approaches to this problem, as surveyed by Hong et al. 2018. "Occupant Behavior Models: A Critical Review of Implementation and Representation Approaches in Building Performance Simulation Programs," Building Simulation 11(1):1-14.

It has further been demonstrated by Phillips, A. J. K., et al. 2019. "High Sensitivity and Interindividual Variability in the Response of the Human Circadian System to Evening Light," PNAS (https://doi.org/10.1073/pnas.1901824116), that individual sensitivity to evening light levels (10 to 50 lux) in terms of melatonin suppression exhibited a 50-fold difference, thereby calling into question the correlation between melanopic exposure and circadian rhythm entrainment or disruption.

Finally, there is increasing evidence that circadian rhythms are entrained by daily changes in sky color at sunrise and sunset rather than specific melanopic irradiance values or doses (e.g., Walmsley, L., et al. 2015. "Colour as a Signal for Entraining the Mammalian Circadian Clock," PLOS Biology 13(4):e1002127, and Patterson, S. S., et al. 2020. "A Color Vision Circuit for Non-Image-Forming Vision in the Primate Retina," Current Biology 30:1-6). If so, the integration of melanopic irradiance over time may need to be further modified by the phase of the observer's circadian clock. This "circadian gating" is a well-known feature of plant circadian rhythms (e.g., Hubbard, K., and A. Dodd. 2016. "Rhythms of Life: The Plant Circadian Clock," The Plant Cell, April, pp. 1-10), and there is no reason to expect that animals, including humans, do not respond similarly (e.g., Pauers, M. J., et al. et al. 2012. "Changes in the Colour of Light Cue Circadian Activity," Animal Behavior 83(5):1143-1151).

SUMMARY OF THE INVENTION

The inventor has realized that there is therefore a need for a system and method of predicting melanopic irradiance and dose in virtual environments, taking into account; 1) multiple light sources with different SPDs; 2) the influence of colored surfaces on reflected light; 3) the contribution of visual display screens and their white point SPDs; 4) the contribution of direct sunlight and diffuse daylight entering the environment; 5) the variability of daylight ranging from minutes to months in timescale; 6) the influence of blinds and shades on the daylight entering the environment; 7) the angular responsivity of the observer to melanopic irradiance; 8) the age of the observer and related corneal yellowing; 9) the integration of melanopic irradiance over time to yield the melanopic dose; 10) the stochastic movement of the observer within the environment; and 11) the influence of changing SPD and time of day on circadian entrainment or disruption, particularly the effect of circadian gating.

By being able to predict a melanopic dose in a virtual environment, such as a model of a building to be constructed, the melanopic dose may be checked to determine whether it is within a suitable range. If not, one or more design parameters of the building may be adjusted before the building is constructed. Such design parameters may include, for example, the number and position of luminaires, the SPD and irradiance of the luminaires, the position and size of the windows, the position and size of fenestration devices, the colour of the walls, the reflectivity of the walls, the colour and texture of the flooring, the colour and reflectivity of the ceiling, the transparency, size and position of glass walls within the building, etc. The same applies to existing buildings, which may be modelled for melanopic dose before undergoing renovation. The melanopic dose rate as calculated, and/or the melanopic dose calculated therefrom, may be used to control luminaires in a building in order to modify the melanopic dose rate. For example, in the building there may be luminaires with different SPDs that can be independently operated, or there may be luminaires with adjustable SPDs. Fenestration devices may be operated to adjust the SPD in the building. Luminaires and fenestration devices may be operated in coordination with each other to control the melanopic dose rate in the building.

There is further a need to measure melanopic irradiance and dose in physical environments, taking into account: 1) multiple light sources with different SPDs; 2) the influence of colored surfaces on reflected light; 3) the contribution of visual display screens and their white point SPDs; 4) the contribution of direct sunlight and diffuse daylight entering the environment; 5) the variability of daylight ranging from minutes to months in timescale; 6) the influence of blinds and shades on the daylight entering the environment; 7) the angular responsivity of the observer to melanopic irradiance; 8) the age of the observer and related corneal yellowing; 9) the integration of melanopic irradiance over time to yield the melanopic dose; 10) the stochastic movement of the observer within the environment; and 11) the influence of changing SPD and time of day on circadian entrainment or disruption, particularly the effect of circadian gating.

Disclosed is a method for calculating melanopic dose rate for a direction of gaze at a position in a virtual environment comprising the steps of: (a) calculating, by a processor, a direct spherical irradiance at the position from one or more light sources, as a function of angle; (b) multiplying, by the processor, the direct spherical irradiance by a melanopic conversion factor that depends on a spectral power distribution of the direct spherical irradiance; (c) calculating, by the processor, an indirect spherical irradiance at the position from multiple light source patches, as a function of angle; (d) multiplying, by the processor, the indirect spherical irradiance by a melanopic conversion factor that depends on a spectral power distribution of the indirect spherical irradiance; (e) adding, by the processor, the products from steps (b) and (d) to form a total spherical melanopic irradiance defined as a function of angle; and (f) multiplying, by the processor, the total spherical melanopic irradiance by an angular responsivity that depends on the direction of gaze, to result in the melanopic dose rate.

Also disclosed is a system for calculating melanopic dose rate for a direction of gaze at a position in a virtual environment comprising a processor, a user interface connected to the processor, and a computer readable memory storing computer readable instructions, which, when executed by the processor cause the processor to: (a) calculate direct spherical irradiance at the position from one or more light sources, as a function of angle; (b) multiply the direct spherical irradiance by a melanopic conversion factor that depends on a spectral power distribution of the direct spherical irradiance; (c) calculate an indirect spherical irradiance at the position from multiple light source patches, as a function of angle; (d) multiply the indirect spherical irradiance by a melanopic conversion factor that depends on a spectral power distribution of the indirect spherical irradiance; (e) add the products from steps (b) and (d) to form a total spherical melanopic irradiance defined as a function of angle; (f) multiply, the total spherical melanopic irradiance by an angular responsivity that depends on the direction of gaze, to result in the melanopic dose rate; and (g) output, via the user interface, the melanopic dose rate.

Further disclosed is a method to measure melanopic irradiance in a physical environment, comprising: rotating a camera about its axis within the physical environment to generate a panoramic image; calibrating the panoramic image to correspond to CIE XYZ tristimulus values of the physical environment at a position of the camera; and using SPD values of one or more light sources in the physical environment to calculate a melanopic irradiance at the position of the camera.

Still further disclosed is a system to measure melanopic irradiance in a physical environment, comprising: a calibrated panoramic digital camera; a device to rotate the camera to generate a panoramic image; a computer configured to calibrate the panoramic image to CIE XYZ tristimulus values at a position of the camera in the physical environment; a database with SPD values of light sources present in the physical environment; and a computer configured to calculate the melanopic irradiance from the CIE XYZ tristimulus values and the SPD values.

DETAILED DESCRIPTION

In designing an illuminance meter for virtual environments, it is assumed that the meter has a specified position and orientation within the three-dimensional space. It may be similarly assumed that a melanopic irradiance meter has a specified position for the observer, but there is no reason to assume a specified orientation. For example, an office worker or student sitting at a desk for an hour or so will most likely direct their gaze in a variety of different directions in response to visual and auditory stimuli. In order to predict a physically plausible melanopic dose over this time period, it is reasonable to consider a stochastic behavioral model for head movement and gaze direction of the observer.

Spherical Irradiance

While the melanopic irradiance for a given orientation taking into account the observer's angular responsivity to said irradiance could be predicted, this becomes computationally expensive for multiple gaze directions. A more efficient approach is to measure the spherical irradiance distribution at the position, and then derive melanopic irradiances for a multiplicity of arbitrary gaze directions from this distribution.

Figure 3:
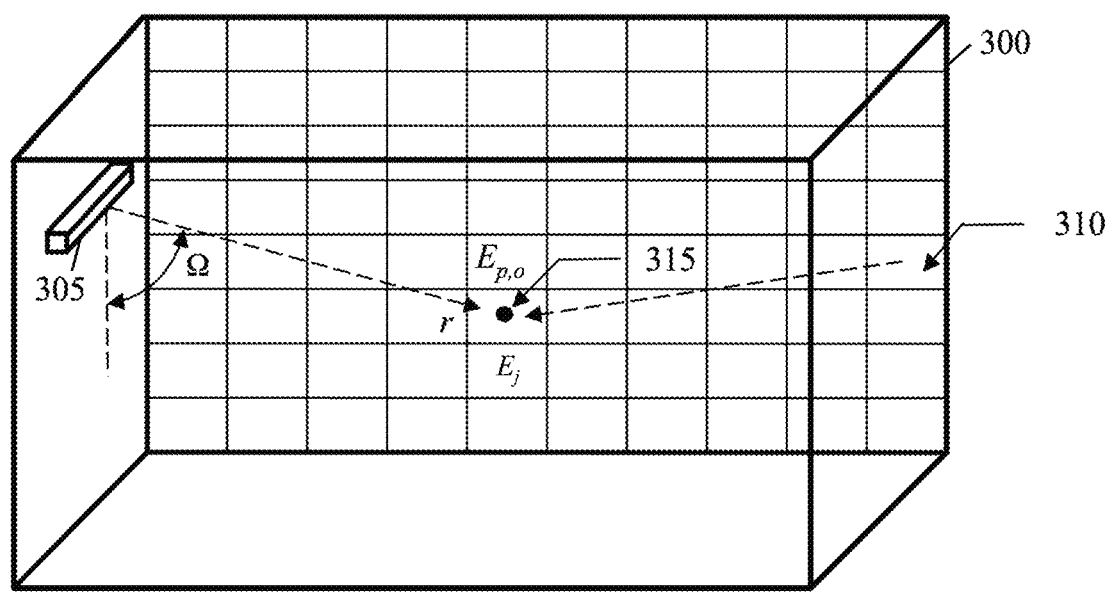
FIG. 3 shows an empty rectangular room with one example surface subdivided into patches and one example light source.

Referring to FIG. 3, this measurement process begins by choosing at an arbitrary meter position 315 in the virtual space 300. If the position (as measured from a light source 305) is at a distance r that is approximately two or more times the diagonal width of the emission area of the light source 305, the light source can be represented as a point source of irradiation p at the center of the emission area, and the direct irradiance $E_{p,o}$ of the position 315 calculated using the inverse square law:

$$E_{p,o} = I_{p,\Omega}/r^2 \tag{1}$$

where $I_{p,\Omega}$ is the radiant intensity of the light source 305 in the direction $\Omega$ (expressed in polar coordinates) of the meter position 315.

If the distance r is less than approximately twice the diagonal width of the emission area of the light source 305, the emission area may be subdivided into a one- or two-dimensional array of smaller subareas such that the diagonal width of each subarea satisfies the distance criterion, and where the total radiant flux $\Phi$ emitted by the light source is evenly divided between them. Each subarea is represented as a point source located at the center of the subarea.

The inverse square law calculation is repeated for each light source or subdivision thereof 305 in the virtual environment that is directly visible from the position 315 to determine the total direct spherical irradiance $E_o$ at the meter position 315. This approach is adapted herein such that the spherical irradiances $E_{p,o}$ and the corresponding directions $\Omega$ for all point sources p are saved in a list assigned to meter position 315. This list represents the direct spherical irradiance as a function of angle $\Omega$ at position 315, where each list element is comprised of:

a) Direct spherical irradiance; and
b) Polar coordinates $\delta$ (horizontal angle) and (vertical angle of light source 305 as seen from position 315.

The same calculation may be repeated for other arbitrary positions of a virtual meter in the virtual environment.

The indirect spherical irradiance at the position 315 is a result of light being reflected from surfaces in the virtual environment that are not themselves light-generating sources, such as the floor, ceiling, and walls. Each surface must be subdivided into an array of small patches (e.g., 310) and their direct irradiance from the light sources and indirect irradiance from light reflected from other patches calculated in order to determine their radiant exitance value $M_e$. This can be done using, for example, the radiosity method described in Ashdown, I. 1994. Radiosity: A Programmer's Perspective. New York, N.Y.: John Wiley & Sons.

Figure 4:
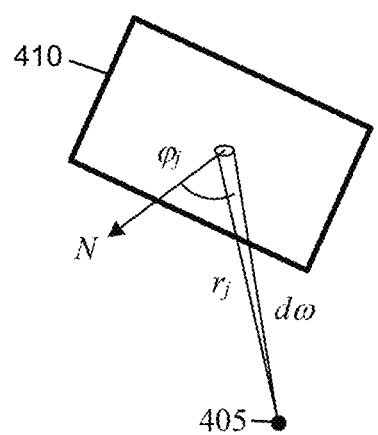
FIG. 4 shows the spherical irradiance received at a point from a single patch.

To calculate the indirect spherical irradiance $E_j$ from each surface patch 310 visible to point 315, and referring to FIG. 4, it is first noted that the spherical irradiance $E_j$ received at point 405 from a patch j (410) with surface area 4 and radiant exitance $M_e$ that is at a distance $r_j$ and at an angle $\varphi_j$ to the surface normal N is:

$$E_j = 1/\pi \int_\Omega M_e d\omega \tag{2}$$

where the differential solid angle $d\omega$ is defined as:

$$d\omega = \cos(\varphi_j) dA_j/r_j^2 \tag{3}$$

Figure 5:
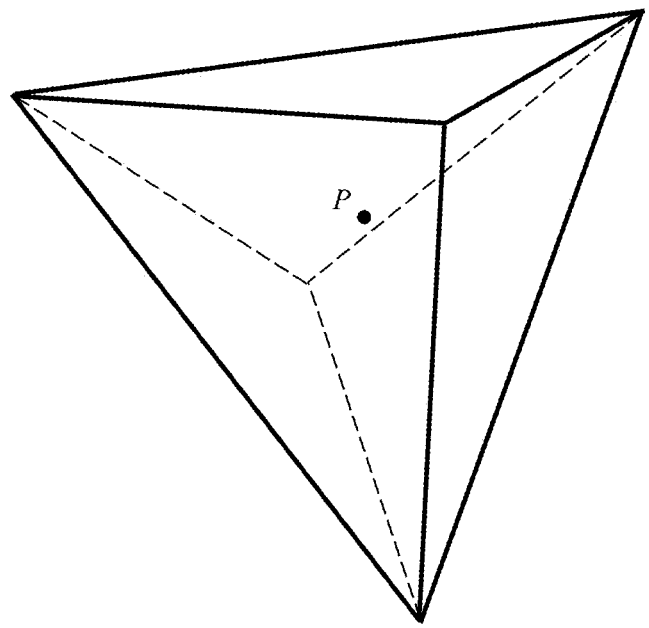
FIG. 5 shows a dual cubic tetrahedron.
Figure 6:
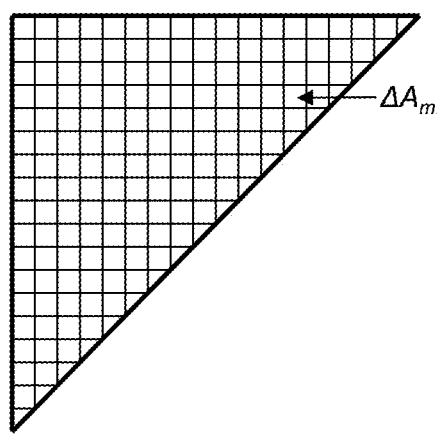
FIG. 6 shows the subdivision of a cubic tetrahedron face into an array of elements.

The integration can be performed by numerical quadrature using a convex polyhedron. In this example a dual cubic tetrahedron, is used. This consists of two back-to-back cubic tetrahedrons measuring two units on each side that are centered on the point P (FIG. 5). Each face of the dual cubic tetrahedron is divided into an array of n=m×m/2 cells with area $\Delta A_m$, as shown in FIG. 6. (The cells along the adjoining edges of the two tetrahedrons have area $\Delta A_m/2$.) Thus, for a given patch j, and a given face of the convex polyhedron from which the patch j is visible:

$$E_j = 1/\pi \Sigma_{i=1}^n M_e \cos(\varphi_j) \Delta A_m/r_j^2 \tag{4}$$

Figure 7:
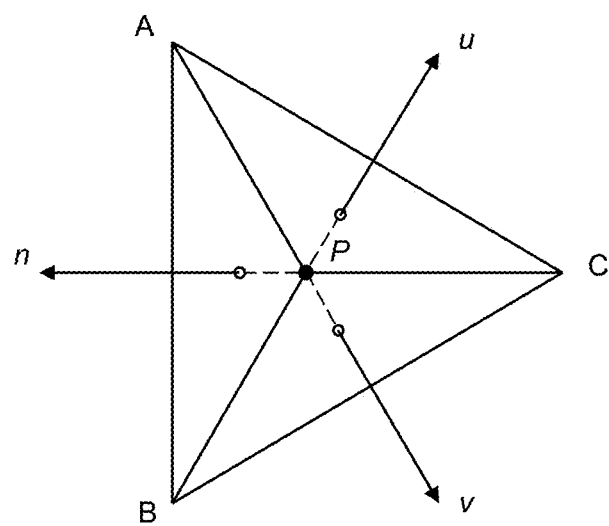
FIG. 7 shows the orientation of a dual cubic tetrahedron with respect to the u-v-n Cartesian coordinate system.

FIG. 7 shows an orthographic projection of the upper cubic tetrahedron aligned on a horizontal plane with a u-v-n Cartesian coordinate system centered on point P and oriented such that each axis intersects a face of the cubic tetrahedron at a distance of unity from point P.

Taking the cubic tetrahedron face intersected by the n-axis as an example, we have for each cell i with variable coordinates $u_i$ and $v_i$:

$$r_i = \sqrt{u_i^2 + v_i^2 + 1} \tag{5}$$

and:

$$\cos(\varphi_i) = 1/r_i \tag{6}$$

Thus, for a given patch j, its contribution to a given cell i in a face of the cubic tetrahedron from which the patch j is visible is:

$$\Delta E_j \approx M_e \Delta A_m / \pi (u_i^2 + v_i^2 + 1)^{3/2} \tag{7}$$

and similarly for all six faces of the cubic tetrahedron.

This can be confirmed by assuming a uniform sphere with unit radiant exitance $M_e$ surrounding the light buffer (i.e. the dual cubic tetrahedron) and centered on point P. A diffusely-emitting surface with radiant exitance M has radiance M/$\pi$ in any direction, which gives:

$$\Delta E_j \approx \Delta A_m / (u_i^2 + v_i^2 + 1)^{3/2} \tag{8}$$

Summing $\Delta E_i$ over all n cells (in the limit $\Delta A_m \to 0$) for each side yields $4\pi$, which is the area of a unit sphere.

Referring to FIG. 7, the cubic tetrahedron faces are oriented with respect to the u-v-n Cartesian coordinate system such that:

$$A = \{-\sqrt{1/6}, \sqrt{1/2}, 0\}$$
$$B = \{-\sqrt{1/6}, -\sqrt{1/2}, 0\}$$
$$C = \{\sqrt{2/3}, 0, 0\}$$
$$D = \{0, 0, 0\}$$
$$u_{CT} = \{\sqrt{1/6}, \sqrt{1/2}, \pm\sqrt{1/3}\}$$
$$v_{CT} = \{\sqrt{1/6}, -\sqrt{1/2}, \pm\sqrt{1/3}\}$$
$$n_{CT} = \{-\sqrt{2/3}, 0, \pm\sqrt{1/3}\}$$
$$apex = \{0, 0, \pm\sqrt{1/3}\}$$

where the $\pm$ symbols are positive for the upper cubic tetrahedron, and negative for the lower one.

Figure 8:
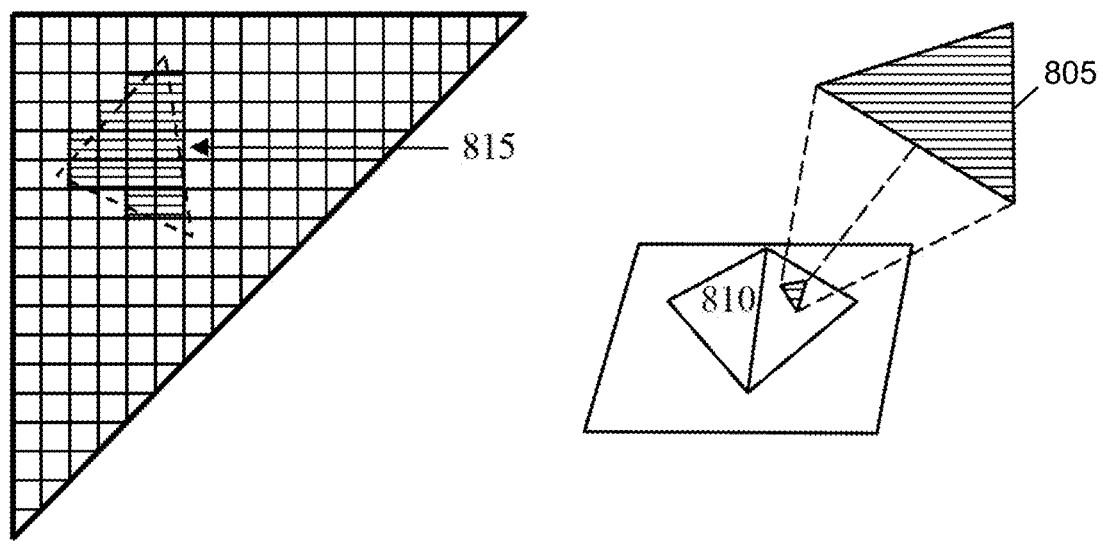
FIG. 8 shows a patch being projected onto the face of a cubic tetrahedron.

FIG. 8 shows a triangular patch 805 being projected onto a face of a cubic tetrahedron 810, where the projection covers the set of face cells 815, wherein the projection process is disclosed in, for example, Chapter 5 of Ashdown, I. 1994. Radiosity: A Programmer's Perspective. New York, N.Y.: John Wiley & Sons.

In an adaptation of the above, the projection of the surface patches 310 onto the six faces of the dual cubic tetrahedron are saved as six triangular arrays with irradiance values for each face cell 815 in accordance with Equation 7. Note that each face cell has a specific direction expressed in polar coordinates from the center P of the dual cubic tetrahedron. Similar to the direct spherical irradiance list, each face cell element is comprised of:

a) Indirect spherical irradiance incident on the face cell; and
b) Polar coordinates δ (horizontal angle) and (vertical angle of the face cell center as seen from the center of the dual cubic tetrahedron.

Figure 11:
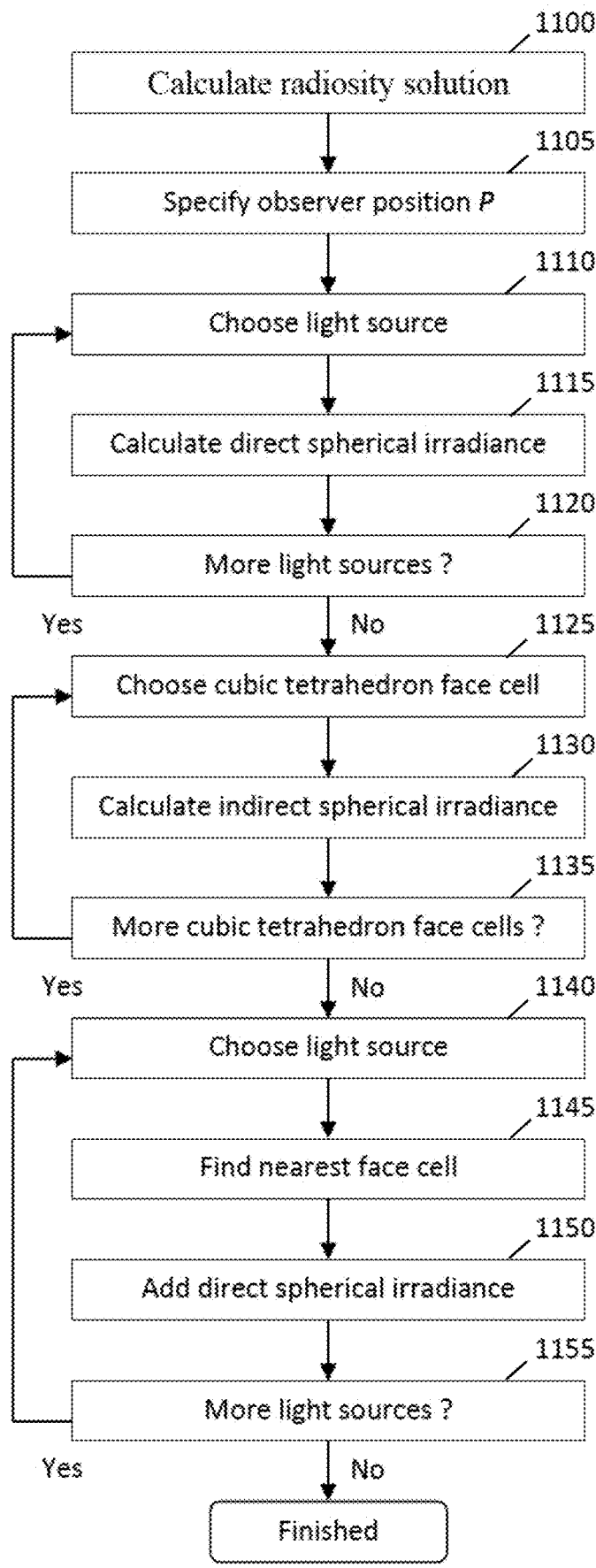
FIG. 11 shows a flowchart presenting the calculation of spherical irradiance for a specified observer position.

FIG. 11 shows a flowchart presenting the calculation of spherical irradiance for a specified observer position. In Step 1100, a radiosity solution is calculated for the virtual environment in order to determine the surface patch exitances. Assuming that the color of each surface is specified as an RGB triplet or (equivalently) as a CIE xyY chromaticity, red, green, and blue radiosity values are calculated in parallel. The light source SPD is assumed to be CIE Standard Illuminant D65 (6500K daylight), as specified in Colorimetry, Fourth Edition, CIE 015:2018).

In Step 1105, an observer position P within the virtual environment is specified.

In Step 1110, a light source is chosen from the set of light sources. (If the light source has been subdivided due to its proximity to the observer position, a light source segment is chosen.)

In Step 1115, the direct spherical irradiance at observer position P is calculated in accordance with Equation 1, along with the polar angle of the light source with respect to the observer position.

In Step 1120, a decision is made as to whether there are more light sources or light source segments to choose. If true, control passes to Step 1110 to choose the next light source or segment. If false, control passes to Step 1125.

In Step 1125, one of the face cells from the six cubic tetrahedron faces is chosen.

In Step 1130, the indirect spherical irradiance at observer position P is calculated in accordance with Equation 7, along with the polar angle of the face cell with respect to the cubic tetrahedron center (i.e., the observer position).

In Step 1135, a decision is made as to whether there are more face cells to choose. If true, control passes to Step 1125 to choose the next face cell. If false, control passes to Step 1140.

In Step 1140, a light source is chosen from the set of light sources. (If the light source has been subdivided due to its proximity to the observer position, a light source segment is chosen.)

In Step 1145, the face cell whose polar angle is closest to the light source polar angle is determined.

In Step 1150, the direct spherical irradiance due to the light source or light source segment is added to the face cell's indirect spherical irradiance.

In Step 1155, a decision is made as to whether there are more light sources or light source segments to choose. If true, control passes to Step 1140 to choose the next light source or segment. If false, the algorithm finishes.

It should be noted that upon completion, the six faces with their square face cells are conceptually equivalent to triangular digital images of the virtual environment as seen from the observer position. It is therefore possible to capture an image of a physical environment with a calibrated 360-degree spherical camera such as the Ladybug5+ manufactured by FLIR Systems, Arlington, Va., and geometrically map the image pixels to the face cells of a cubic tetrahedron.

Angular Responsivity

Figure 9:
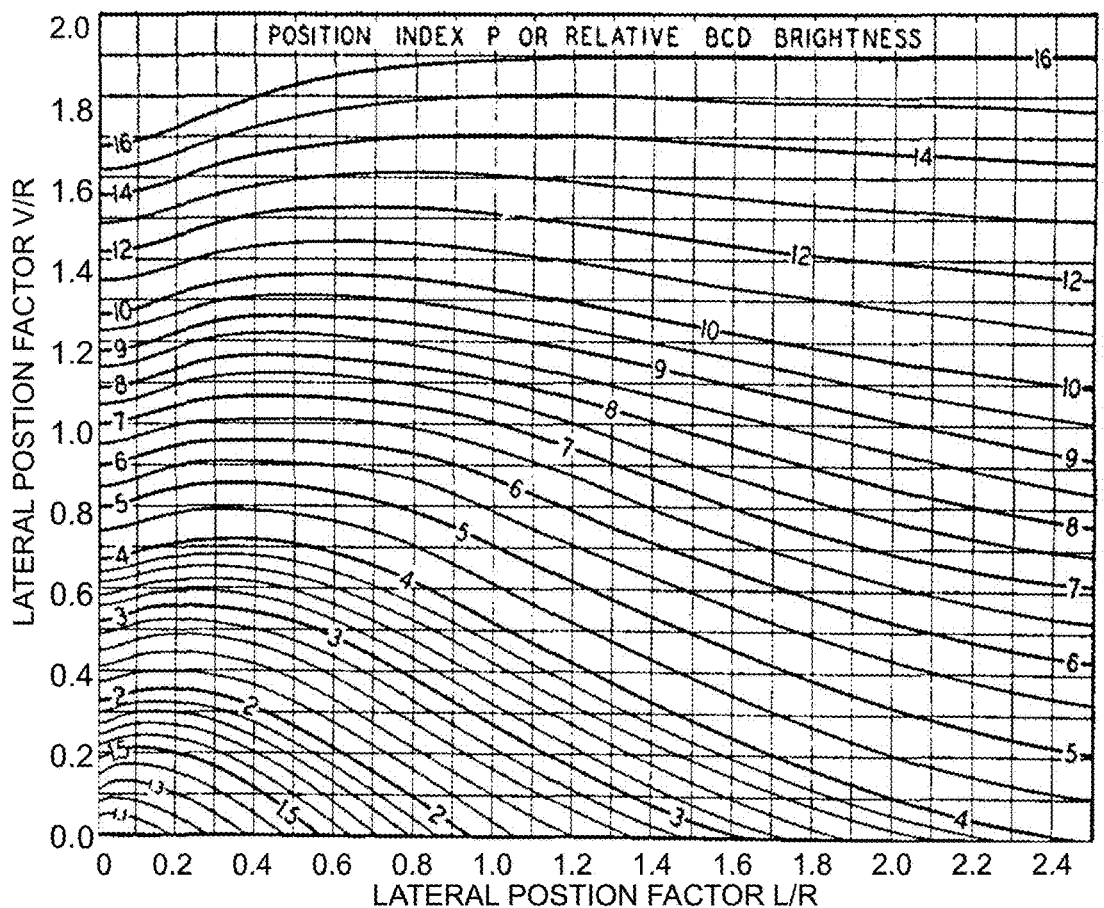
FIG. 9 shows a plot of the Guth position index.
Figure 10:
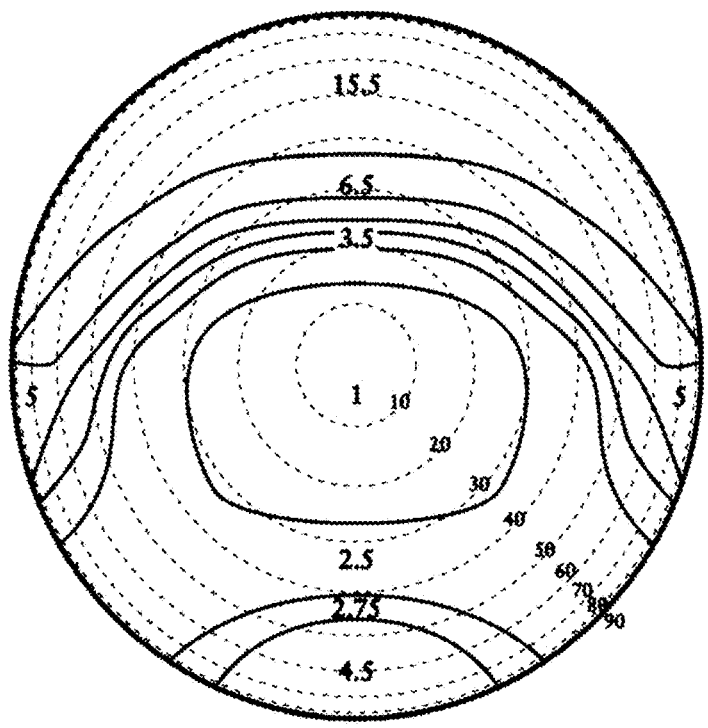
FIG. 10 shows the discomfort glare angular responsivity plot.

The angular responsivity of an observer with respect to gaze direction may be represented as an analytic function or tabulation of values at discrete angles. The simplest representation is the field of view limits presented in CIE System for Metrology of Optical Radiation for ipRGC-Influenced Responses to Light, CIE S 026/E:2018, but it is more reasonable to assume that the angular responsivity of a typical observer will be similar to that of an observer's responsivity to discomfort glare. Discomfort Glare in Interior Lighting, CIE 117-1995, for example, presents a tabulation of "Guth position indices" relative to the gaze direction (Guth, S. K. 1951. "Brightness Relationships for Comfortable Seeing," Journal of the Optical Society of America 41(4):235-244), while Levin, R. E. 1975. "Position Index in VCP Calculations," Journal of the Illuminating Engineering Society 4(2):99-105, presents an analytic function that was empirically derived from the tabulated values. A nomogram of the Guth position indices is shown in FIG. 9, while a hemispherical plot of the (inverse) angular responsivity to discomfort glare from Jakubiec. J. A. and C. F. Reinhart. 201. "The 'Adaptive Zone'—A Concept for Assessing Discomfort Glare throughout Daylight Space," Lighting Research and Technology 44(2)149-170, is shown in FIG. 10.

The gaze direction of an observer can be described in terms of three orthonormal vectors u, v, and n, where n is the gaze direction, v is the "view-up" direction for the observer, and u is the direction of the right-hand rule for vectors v and n (e.g., Ashdown, I. 1994. Radiosity: A Programmer's Perspective. New York, N.Y.: John Wiley & Sons). Given the direction of a dual cubic tetrahedron face cell as a vector a, this vector can be rotated into the observer's view coordinate system and expressed as an angular responsivity vector c (expressed in Cartesian coordinates) as:

$$\begin{bmatrix} c_x \\ c_y \\ c_z \end{bmatrix} = \begin{bmatrix} u_x & u_y & u_z \\ v_x & v_y & v_z \\ n_x & n_y & n_z \end{bmatrix} \begin{bmatrix} a_x \\ a_y \\ a_z \end{bmatrix} \quad (9)$$

The melanopic irradiance $E_{mel}$ that is detected by a virtual observer then becomes:

$$E_{mel} = K_{mel} \Sigma_{i=1}^m S_i M_e \Delta A_i / \pi (u_i^2 + v_i^2 + 1)^{3/2} \quad (10)$$

where $S_i$ is the angular responsivity to melanopic irradiance in the direction of face cell i relative to the gaze direction, and $K_{mel}$ is a constant that is dependent on the SPD of the incident light. The summation is over all six faces of the dual cubic tetrahedron, in contrast to the summation over a single face in Equation (4).

Spectral Responsivity

Figure 2:
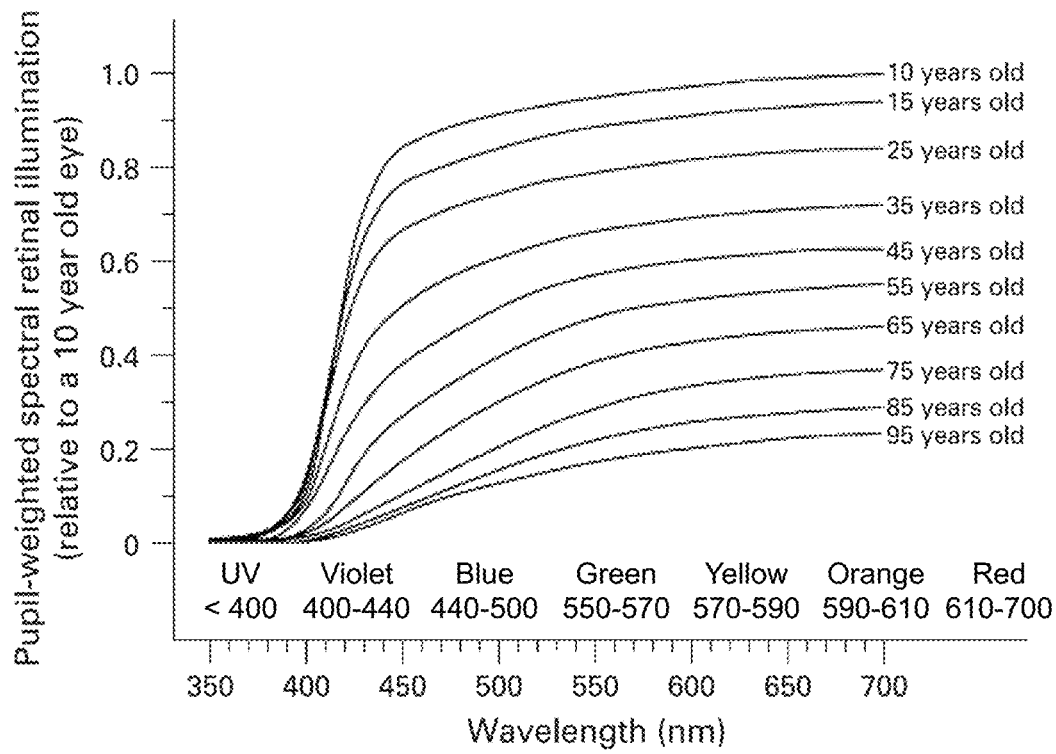
FIG. 2 shows the change in human corneal spectral transmittance with age.

The angular responsivity function or tabulation may also incorporate the age-related melanopic action spectrum due to corneal yellowing (e.g., Turner, P. L., and M. A. Mainster. 2008. "Circadian Photoreception: Ageing and the Eye's Important Role in Systemic Health," British Journal of Ophthalmology 92:1439-1444), as shown in FIG. 2.

Multiple Light Sources

As noted above, a virtual environment may include light sources with different SPDs with both direct and indirect light incident upon the observer. (Display screens in a virtual environment may be modeled as emissive surfaces with their own SPDs.) In addition, some light sources may be switched on and off or dimmed during the day.

For the purposes of calculating melanopic irradiance at the observer position, light sources may need to be grouped by SPD and/or lighting control channel, and the virtual environment surface patch exitances calculated separately for each group.

Daylight

The variability of daylight ranges in timescale from minutes to months. As disclosed in U.S. Pat. No. 9,955,552, historical weather records providing hourly direct normal and diffuse horizontal irradiances for a Typical Meteorological Year can be employed to calculate the ingress of direct solar and diffuse daylight into an interior environment, and from this the melanopic irradiance due to natural lighting. Sky models such as, for example, Bruneton, E. 2016. "A Qualitative and Quantitative Evaluation of 8 Clear Sky Models," IEEE Transactions on Visualization and Computer Graphics 23(12):2641-2655, can further be employed to calculate the hourly daylight SPD for both direct sunlight and diffuse daylight, including near sunrise and sunset when the sky color changes rapidly.

Modeling dynamic daylight requires representing 4,380 radiant exitances values of each surface patch in order to represent hourly weather records in a typical meteorological year. As previously discussed, the spectral power distribution of daylight is remarkably constant, and be represented by that of CIE D65 daylight (Colorimetry, Fourth Edition, CIE 015:2018).

Colored Surfaces

The SPD of light indirectly reflected or transmitted by colored surfaces will differ from that of the light incident on the surfaces. As disclosed in U.S. Pat. No. 10,785,849 and US Patent Application 2021/0003452, it is sufficient to model the SPDs of all light sources, including daylight, as having the same SPD, such as for example that of CIE Standard Illuminant D65 (6500K) daylight. A radiosity solution is calculated for the virtual environment, which will generate a CIE XYZ tristimulus value $M_s$ for each dual cubic tetrahedron face cell. Summing these values in accordance with:

$$E_{XYZ} = \Sigma_{i=1}^m S_i M_s \Delta A_i / \pi (u_i^2 + v_i^2 + 1)^{3/2} \quad (11)$$

will give the observer irradiance as a CIE XYZ tristimulus value, which can be transformed into a canonical spectral irradiance distribution. This SPD may then be multiplied on a per-wavelength basis by the light source group SPD and the melanopic action spectrum to calculate the melanopic irradiance $E_{mel}$ for each light source group.

Figure 12:
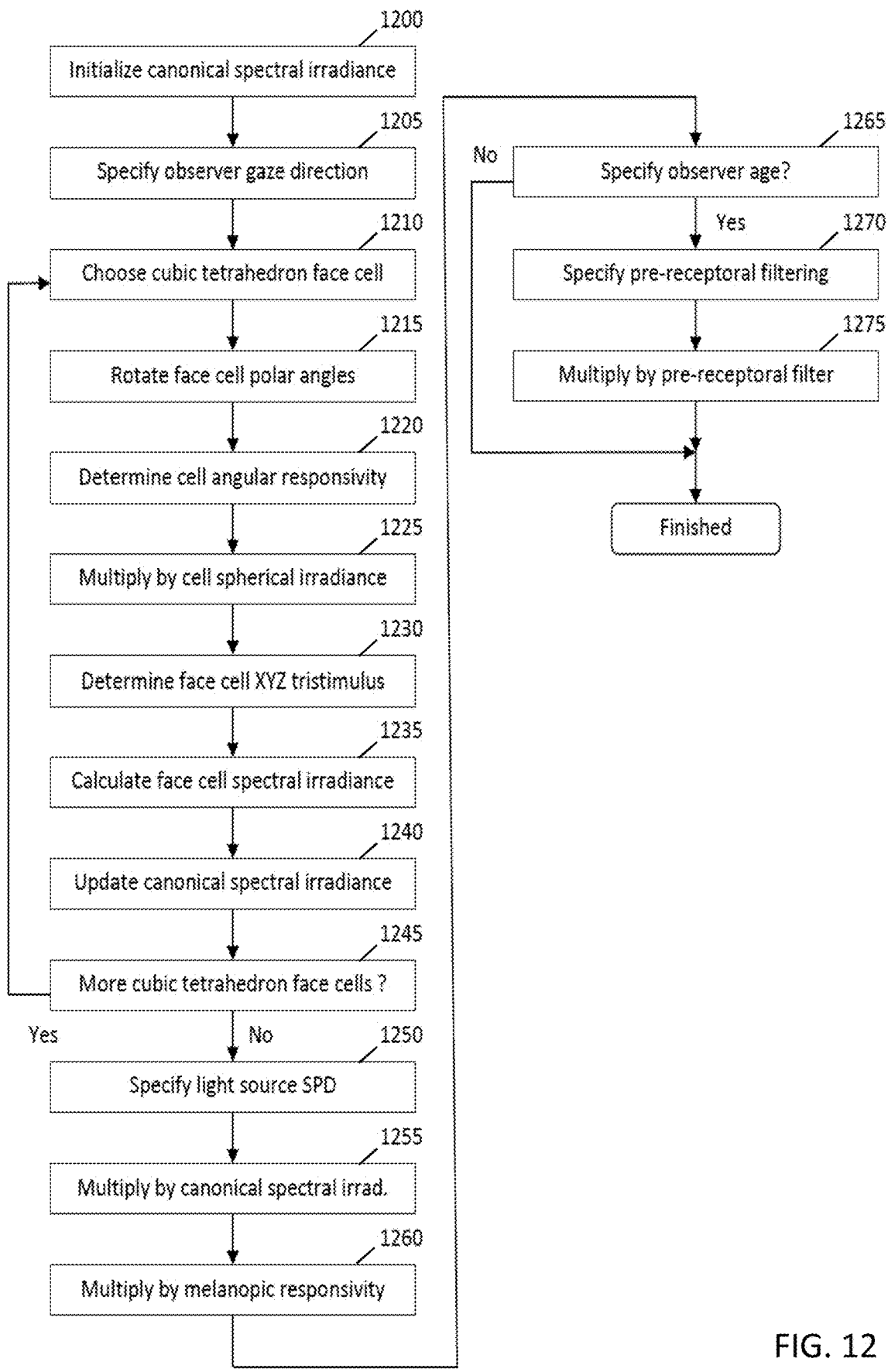
FIG. 12 shows a flowchart presenting the calculation of melanopic irradiance from spherical irradiance for a specified observer gaze direction.

FIG. 12 shows a flowchart presenting the calculation of melanopic irradiance from spherical irradiance for a specified observer gaze direction. In Step 1200, and in reference to US Patent Application 2021/0003452, the canonical spectral irradiance is initialized to zero.

In Step 1205, an observer gaze direction for a precalculated observer position is specified.

In Step 1210, one of the face cells from the six cubic tetrahedron faces is chosen.

In Step 1215, the selected face cell polar angles are rotated in accordance with Equation 9.

In Step 1220, the face cell angular responsivity is determined analytically or by table lookup.

In Step 1225, the face cell spherical irradiance (which may include direct spherical irradiance due to a light source) is multiplied by the face cell angular responsivity.

In Step 1230, the face cell RGB values are used with the face cell spherical irradiance value to calculate the face cell CIE XYZ tristimulus value $M_s$.

In Step 1235, the face cell canonical spectral irradiance is calculated in accordance with US Patent Application 2021/0003452.

In Step 1240, the face cell canonical spectral irradiance is added to the canonical spectral irradiance.

In Step 1245, a decision is made as to whether there are more face cells to choose. If true, control passes to Step 1210 to choose the next face cell. If false, control passes to Step 1250.

In Step 1250, the light source SPD is specified.

In Step 1255, the canonical spectral irradiance is multiplied on a per-wavelength basis by the light source SPD.

Figure 1:
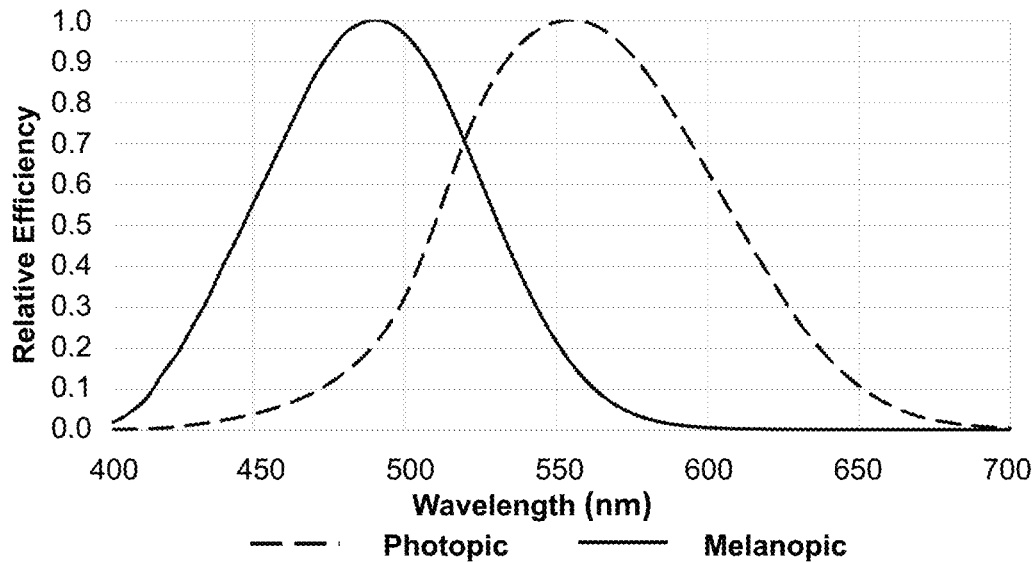
FIG. 1 shows the CIE photopic and melanopic action spectra.

In Step 1260, the resultant spectral irradiance is multiplied on a per-wavelength basis by the melanopic responsivity function (FIG. 1) to obtain the standard (25 year-old) melanopic irradiance.

In Step 1265, a decision is made whether the observer age is to be considered. If true, control proceed to Step 1270; otherwise the algorithm finishes.

In Step 1270, the observer age and associated pre-receptoral filtering function (FIG. 2) is optionally specified.

In Step 1275, the melanopic irradiance is multiplied by the pre-receptoral filtering function on a per-wavelength basis, following which the algorithm finishes.

While the above provides the ability to calculate melanopic irradiance for any gaze direction from a specified position, it is reasonable to assume that the gaze direction for an observer while standing will be approximately horizontal. Given this, a virtual environment can include a horizontal or approximately horizontal plane wherein the observer is likely to be standing or walking, in accordance with stochastic movement models (e.g., Hong et al. 2018). Melanopic irradiance meters can be positioned at intervals within this plane, with a small number of gaze directions (for example, at 30-degree intervals about the vertical axis) to represent precomputed melanopic irradiance values. Calculating melanopic dose would then require multiplying the irradiance values by the observer dwell time at each occupied position and gaze direction, or interpolating values between adjacent positions and gaze orientations.

Finally, circadian gating may be implemented with a time-dependent function that selectively weights the calculated melanopic dose at predetermined times of the day.

Figure 14:
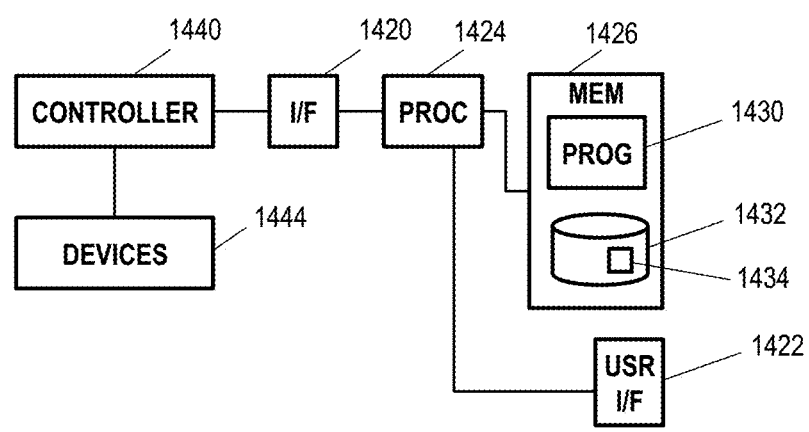
FIG. 14 is a schematic diagram of an exemplary system for the measurement or prediction of melanopic dose and dose rate.
Figure 15:
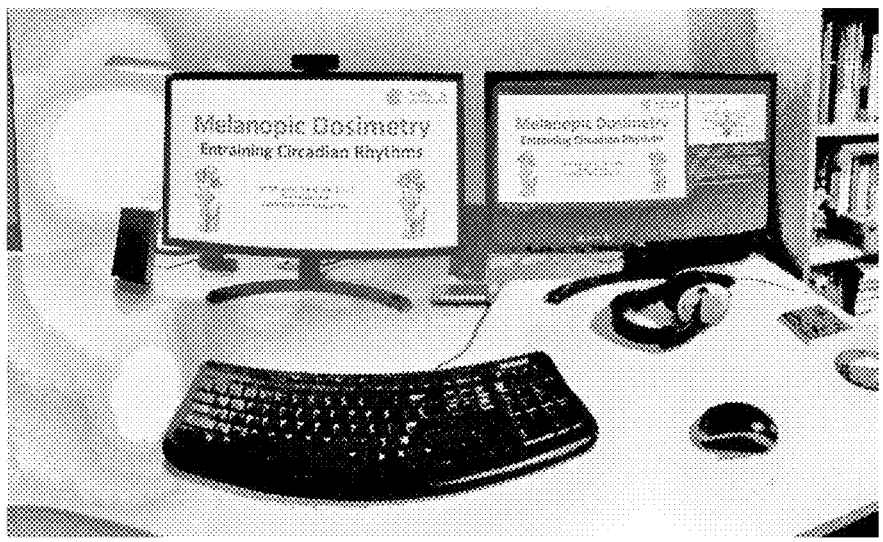
FIG. 15 shows three panoramic images with electric lighting, daylighting, and a combination of the two.
Figure 15:
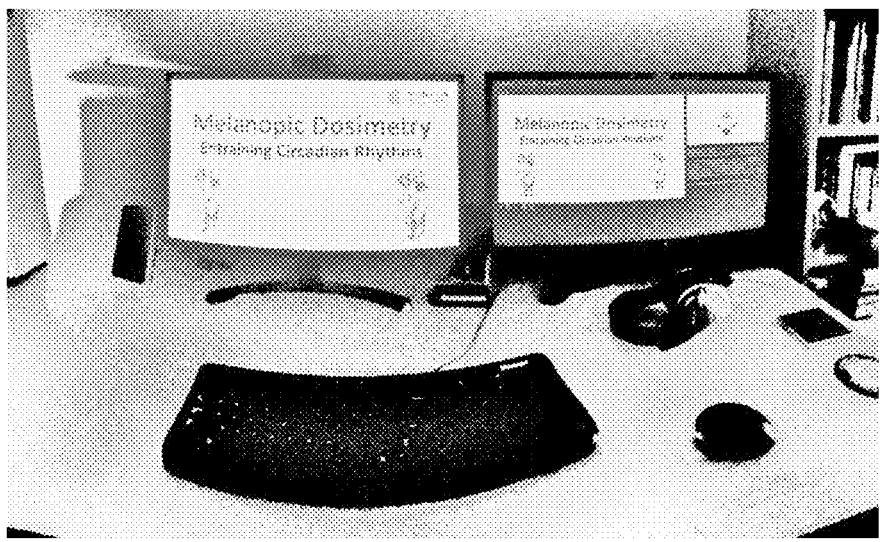
Figure 15:

FIG. 14 shows an exemplary system for predicting and/or calculating the melanopic dose or dose rate. A processor 1424, which may include multiple constituent processors, is connected to one or more interfaces 1420, 1422 and also to one or more computer-readable memories 1426 storing a program 1430 in the form of computer-readable instructions, which, when executed by the processor, cause the system to follow the processes described in relation to FIGS. 11 and 12. The memory 1426 also stores computer-readable data 1432, which is used by the processor 1424 to run the program 1430. The data 1432 is created by the program 1430, by an external program, or both. Data 1432 includes a model of a virtual environment 1434, which corresponds to the environment for which the melanopic dose and dose rate are being calculated. User interface 1422, which may include a display, allows a user to input or create a model of an environment for which the melanopic dose and dose rate are to be calculated, and to receive an output from the system that indicates the melanopic dose rate or dose. Interface 1420 may be connected to a controller 1440 for one or more luminaires and/or fenestration devices 1444 in a building, which are controlled by the system to provide a desired level of melanopic dose rate at a given time, or a desired melanopic dose over a period of time.

Figure 13:
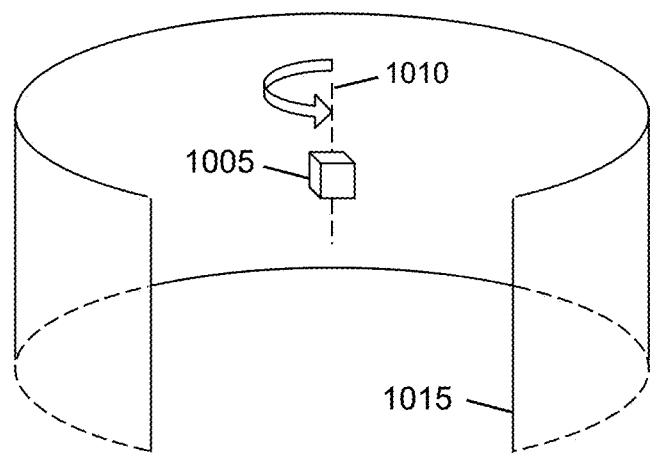
FIG. 13 shows a digital camera being rotated about a vertical axis to obtain a panoramic image.

The melanopic irradiance for a given observer position can also be measured in a physical environment. Referring to FIG. 13, a calibrated digital camera 1005 with high dynamic range and panorama generation capabilities is rotated about axis 1010 to generate a panoramic image 1015, wherein the height of the image corresponds to an angular range of approximately 120 degrees (50 degrees above and 70 degrees below the horizontal meridian) indoors and 90 degrees (20 degrees above and 70 degrees below) outdoors in direct sunlight.

Given a calibrated panorama image wherein the red-green-blue pixel luminances correspond to CIE XYZ tristimulus values, and if the light source SPD is known or can be measured with a spectroradiometer, the melanopic irradiance for a given view direction, taking into account the angular responsivity of the observer to melanopic irradiance and the observer age, can be calculated. This calculation can be done by, for example, by following steps similar to those described in PCT publication WO2018/227305, paragraphs [0067]-[0134].

If multiple light sources with different SPDs are present (including visual display screens and daylight), additional panoramic images can be captured and analyzed for each light source SPD. These images may take into account changes in daylight due to changing sky conditions and time of day, as well as the effects of blinds and shades. The overall melanopic irradiance is then the sum of the melanopic irradiance calculated for each light source.

As an example, FIG. 14 shows three panoramic images, wherein the first image shows a physical environment illuminated by electric lighting, the second image shows the same environment illuminated by diffuse daylight, and the third image shows the same environment illuminated by both electric lighting and diffuse daylight.

The embodiments of the invention may be varied in many ways. Such variations are not to be regarded as a departure from the scope of the invention, and all such modifications as would be obvious to one skilled in the art are intended to be included within the scope of the claims.

I claim:

1. A method for calculating melanopic dose rate for a direction of gaze at a position in a virtual environment comprising the steps of:
   a) calculating, by a processor, a direct spherical irradiance at the position from one or more light sources, as a function of angle;
   b) multiplying, by the processor, the direct spherical irradiance by a melanopic conversion factor that depends on a spectral power distribution of the direct spherical irradiance;
   c) calculating, by the processor, an indirect spherical irradiance at the position from multiple light source patches, as a function of angle;
   d) multiplying, by the processor, the indirect spherical irradiance by a melanopic conversion factor that depends on a spectral power distribution of the indirect spherical irradiance;
   e) adding, by the processor, the products from steps (b) and (d) to form a total spherical melanopic irradiance defined as a function of angle; and
   f) multiplying, by the processor, the total spherical melanopic irradiance by an angular responsivity that depends on the direction of gaze, to result in the melanopic dose rate.

2. The method of claim 1, comprising calculating, by the processor, a melanopic dose by multiplying the melanopic dose rate by a dwell time of a virtual observer.

3. The method of claim 1 wherein:
   the position is a position of a virtual meter in the virtual environment;
   the one or more light sources include virtual representations of direct solar and diffuse daylight; and
   step (c) comprises projecting each light source patch onto one or more subdivided surfaces of a convex polyhedron that encloses the position.

4. The method of claim 3, wherein the convex polyhedron is a dual cubic tetrahedron.

5. The method of claim 1, wherein the virtual environment is a model of a building and the method comprises adjusting, by a user, a design element in the model to modify the melanopic dose rate.

6. The method of claim 5, comprising incorporating the adjusted design element in the building.

7. The method of claim 1, wherein the virtual environment is a model of a building and the method comprises verifying that the melanopic dose rate is within a predetermined range.

8. The method of claim 1, comprising:
   modeling, by a user, an interior of a building to result in the virtual environment;
   providing, by the user, the virtual environment to the processor; and
   obtaining, by the user via an interface connected to the processor, the melanopic dose rate.

9. A system for calculating melanopic dose rate for a direction of gaze at a position in a virtual environment comprising:
   a processor;
   a user interface connected to the processor; and
   a computer readable memory storing computer readable instructions, which, when executed by the processor cause the processor to:
   a) calculate direct spherical irradiance at the position from one or more light sources, as a function of angle;
   b) multiply the direct spherical irradiance by a melanopic conversion factor that depends on a spectral power distribution of the direct spherical irradiance;
   c) calculate an indirect spherical irradiance at the position from multiple light source patches, as a function of angle;
   d) multiply the indirect spherical irradiance by a melanopic conversion factor that depends on a spectral power distribution of the indirect spherical irradiance;
   e) add the products from steps (b) and (d) to form a total spherical melanopic irradiance defined as a function of angle;
   f) multiply, the total spherical melanopic irradiance by an angular responsivity that depends on the direction of gaze, to result in the melanopic dose rate; and
   g) output, via the user interface, the melanopic dose rate.

10. The system of claim 9, wherein the virtual environment is a model of a building, the system comprising a controller connected to the processor and configured to control a luminaire or a fenestration device in the building to provide a required melanopic dose rate in the building.

11. A method to measure melanopic irradiance in a physical environment, comprising: rotating a camera about its axis within the physical environment to generate a panoramic image; calibrating the panoramic image to correspond to CIE XYZ tristimulus values of the physical environment at a position of the camera; and using spectral power distribution values of one or more light sources in the physical environment to calculate a melanopic irradiance at the position of the camera.

12. The method of claim 11 wherein the one or more light sources include daylight, the method further comprising:
including changes in the daylight due to changing sky conditions and time of day; and
including effects of fenestration devices in the calculation.

13. A system to measure melanopic irradiance in a physical environment, comprising: a calibrated panoramic digital camera; a device to rotate the camera to generate a panoramic image; a computer configured to calibrate the panoramic image to CIE XYZ tristimulus values at a position of the camera in the physical environment; a database with spectral power distribution values of light sources present in the physical environment; and a computer configured to calculate the melanopic irradiance from the CIE XYZ tristimulus values and the SPD values.

14. The system of claim 13 comprising a database storing daylight data.

15. The system of claim 13 comprising a database storing data of fenestration devices present in the physical environment.

* * * * *